(12) United States Patent
McCurdy

(10) Patent No.: US 6,238,738 B1
(45) Date of Patent: May 29, 2001

(54) METHOD FOR DEPOSITING TITANIUM OXIDE COATINGS ON FLAT GLASS

(75) Inventor: Richard J. McCurdy, Aswood, IL (US)

(73) Assignee: Libbey-Owens-Ford Co., Toledo, OH (US)

(*) Notice: Subject to any disclaimer, the term of this patent is extended or adjusted under 35 U.S.C. 154(b) by 0 days.

(21) Appl. No.: 09/657,275

(22) Filed: Sep. 7, 2000

Related U.S. Application Data

(63) Continuation of application No. 09/199,539, filed on Nov. 25, 1998, now abandoned, which is a continuation of application No. 08/696,203, filed on Aug. 13, 1996, now abandoned.

(51) Int. Cl.$^7$ .......................... C23C 16/40; C03C 17/245
(52) U.S. Cl. .................. 427/255.19; 427/255.31; 427/255.36; 427/255.7; 427/166; 65/60.5; 65/60.52
(58) Field of Search .................. 427/255.11, 255.19, 427/255.31, 255.36, 255.7, 166; 65/60.5, 60.52, 60.2

(56) References Cited

U.S. PATENT DOCUMENTS

| | | |
|---|---|---|
| 4,329,379 | 5/1982 | Terneu et al. . |
| 4,351,267 | 9/1982 | Kalbskopf et al. . |
| 4,751,149 | 6/1988 | Vijayakumar et al. . |
| 4,878,934 | 11/1989 | Thomas et al. . |
| 4,971,843 | 11/1990 | Michelotti et al. . |
| 4,997,576 | 3/1991 | Heller et al. . |
| 5,041,150 | 8/1991 | Grundy et al. . |
| 5,194,161 | 3/1993 | Heller et al. . |
| 5,256,616 | 10/1993 | Heller et al. . |
| 5,308,458 | 5/1994 | Urwin et al. . |
| 5,393,593 | 2/1995 | Gulotta et al. . |
| 5,505,989 | 4/1996 | Jenkinson . |
| 5,514,454 | 5/1996 | Boire et al. . |
| 5,580,364 | 12/1996 | Goodman et al. . |
| 5,853,866 | 12/1998 | Watanabe et al. . |
| 5,939,194 | 8/1999 | Hashimoto et al. . |
| 5,980,983 * | 11/1999 | Gordon .......................... 427/226 |
| 6,013,372 | 1/2000 | Hayakawa et al. . |
| 6,027,766 | 2/2000 | Greenberg et al. . |
| 6,027,797 | 2/2000 | Watanabe et al. . |
| 6,037,289 | 3/2000 | Chopin et al. . |
| 6,054,227 | 4/2000 | Greenberg et al. . |
| 6,090,489 | 7/2000 | Hayakawa et al. . |

FOREIGN PATENT DOCUMENTS

| | | |
|---|---|---|
| 684075 A1 | 11/1995 | (EP) . |
| 737513 A1 | 10/1996 | (EP) . |
| 1500587 | 5/1978 | (GB) . |
| 1523991 | 9/1978 | (GB) . |
| 1524326 | 9/1978 | (GB) . |
| 2150044 | 6/1985 | (GB) . |
| 63-100042 | 5/1988 | (JP) . |
| 97/07069 | 2/1997 | (WO) . |
| 97/10186 | 3/1997 | (WO) . |
| 98/41480 | 9/1998 | (WO) . |

OTHER PUBLICATIONS

Hass, Georg, Oxide Layers Deposited from Organic Solutions, Physics of THin Films, 1969, pp. 87 and 105–115, vol. 5, Academic Press, New York and London.

Toshiya Watanabe, et al., Photocatalytic Activity of TiO2 Thin Film under Room Light, Photocatalytic Purificaiton and Treatment of Water and Air, Elsevier Science Publishers 1993, pp. 747–751.

Kamata, Kamata, et al., Rapid formation of TiO2 films by a conventional CVD method, Journal of Materials Science, Letters 9 (1990) pp. 316–319, Chapman and Hall Ltd.

Hass, Georg; Thun, Rudolf E., Ed.; *Physics of Thin Films*; vol. 5, Academic Press, New York, 1969, p. 237, pp. 304–306.

Pierson, Hugh O.; *Handbook of Chemical Vapor Deposition (CVD)*; Noyes Publications, Park Ridge, NJ, 1992, pp. 231–237.

Takashi, Manasari et al., "PT–TIO2 Thin Films on Glass Substrates as Efficient Photocatalysts"; J. Mat. Sci., 24(1989) pp243–246.

Fukayama, S. et al.; "Highly Tranparent and Photoactive TIO2 Thin Film Coated on Glass Substrate"; 187th Electochemical Society Meeting, Abstract No. 735, Extended Abstracts 95–1 (Available at Least by Mar. 1995). pp 1102–1103.

Weinberger, B.R. et al.; "Titanium Dioxide Photocatalysts Produced by Reactive Magnetron Sputtering"; Appl. Phys. Lett. 66 (1995) pp2409–2411.

Kiernan, Vincent; "A Clearer Vie WFor Car Drivers"; New Scientist, Aug. 26, 1995, p. 19.

Paz, Y; Luo, A.; "Photooxidative Self–Cleaning Transparent Titanium Dioxide Films on Glass", J. Mater.Res., vol. 10 No. 11 (1995) pp2842–2848.

* cited by examiner

Primary Examiner—Shrive Beck
Assistant Examiner—Bret Chen
(74) Attorney, Agent, or Firm—Marshall & Melhorn, LLC

(57) ABSTRACT

A chemical vapor deposition process for laying down a tin or titanium oxide coating on a glass substrate through the use of an organic oxygen-containing compound and the corresponding metal tetrachloride. The organic oxygen compound is preferably an ester having an alkyl group with a β hydrogen in order to obtain a high deposition rate. The resulting article has a tin or titanium oxide coating which can be of substantial thickness because of the high deposition rates attainable with the novel process, and, in the case of titanium oxide coating possesses a desirable refractive index greater than 2.4. The coating growth rates resulting from the method of the present invention may be at least 130 Å per second.

23 Claims, 3 Drawing Sheets

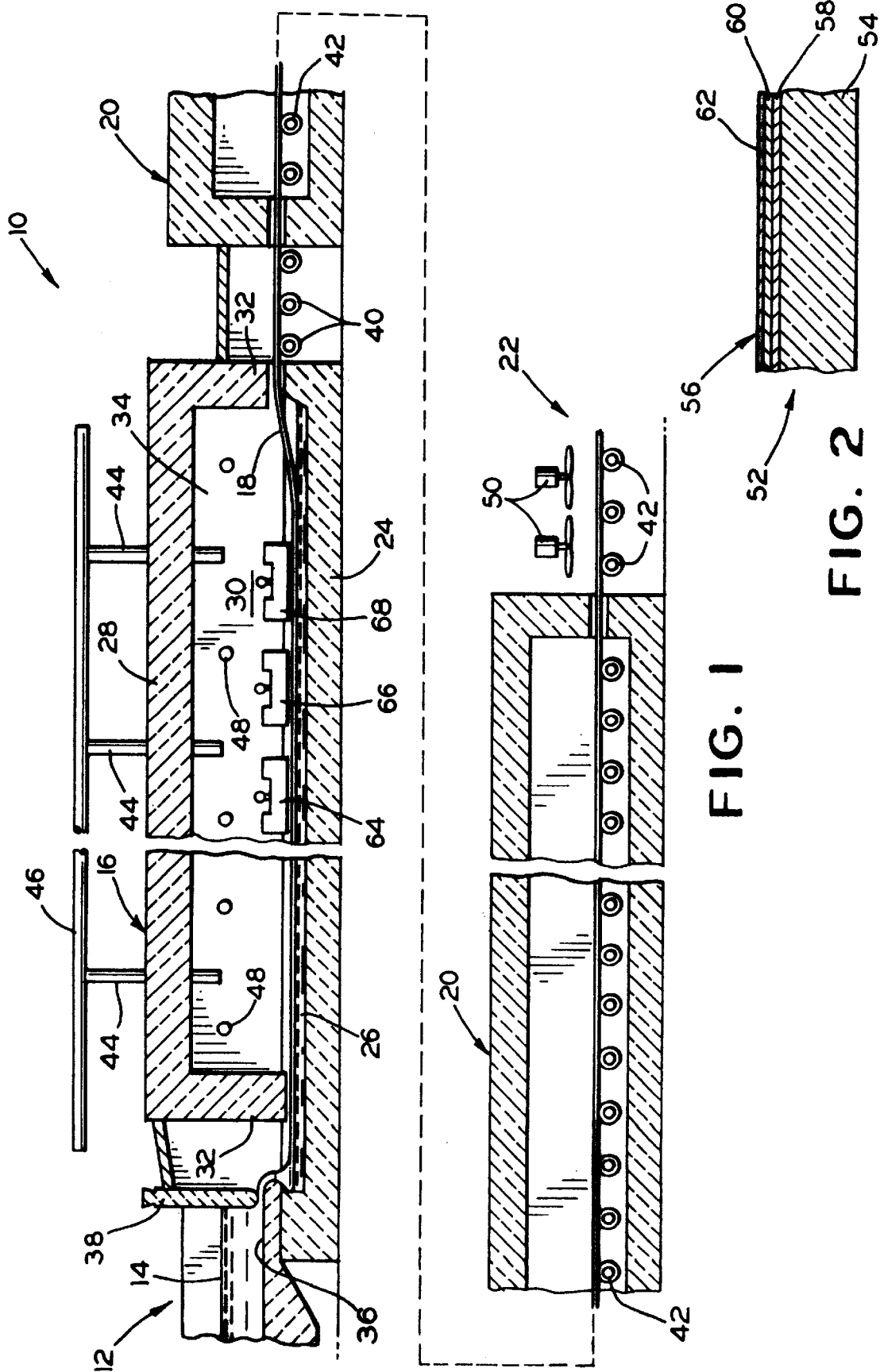

METHOD FOR DEPOSITING TITANIUM OXIDE COATINGS ON FLAT GLASS

RELATED APPLICATION

This application is a continuation of application Ser. No. 09/199,539 filed Nov. 25, 1998, which is a continuation of application Ser. No. 08/696,203 filed Aug. 13, 1996, both of which are hereby incorporated by reference. This application is claiming the benefit under 35 U.S.C. §120 of said application Ser. No. 09/199,539 filed under 35 U.S.C. §111.

BACKGROUND OF THE INVENTION

1. Field of the Invention

This invention relates to a process for depositing titanium oxide and tin oxide coatings on a flat glass substrate, and the resulting coated glass. More particularly, this invention relates to a chemical vapour deposition process for producing titanium oxide and tin oxide coatings on flat glass using a coating precursor gas mixture comprising the corresponding metal tetrachloride and an organic oxidant.

2. Summary of Related Art

Titanium oxide and tin oxide coatings have been proposed for use on glass containers, for example bottles, to improve the mechanical strength of the containers. It has also been proposed to use both titanium oxide and tin oxide coatings on flat glass to modify the characteristics of the glass for architectural use; titanium oxide coatings deposited under vacuum (by reactive sputtering) are used as components of sputtered multi-layer infrared reflecting coatings, while tin oxide coatings are used, not only as layers of multi-layer sputtered coatings, but also deposited pyrolytically with a dopant as infrared reflecting and/or electroconducting coatings.

GB patent specification 1 115 342 describes a process for producing glass containers with good inherent strength and good abrasion resistance by spraying the containers, while still hot from the manufacturing process, with a solution or dispersion of stannic chloride (that is, tin tetrachloride) in an organic liquid, isopropyl alcohol being preferred. A small amount of titanium chloride may be incorporated as a modifier. The liquid solution is fed to atomisers, which may be of the pressure jet variety, located on either side of a tunnel over a conveyor for hot glass bottles to produce a 'mist of liquid reagent' so that a layer of liquid is formed on all the external surfaces of the bottles where it reacts to form a layer of tin oxide.

GB patent specification 1 187 784 describes an improvement of the process described in GB patent specification 1 115 342 and apparently more suitable for incorporation into a process for the automatic manufacture of glassware without interfering with the normal running of such process and without requiring additional supervision. The specification proposes to treat glass containers, at high temperature, with a liquid solution of an organic compound of tin "which compound has properties such that upon application of heat it decomposes into two materials, one of which is an organic compound of tin of high decomposition temperature which reacts with the glass surface to produce a diffusion layer of tin oxide within the glass surface, while the other is a volatile compound of tin such that a substantial proportion of vapour of said compound is produced, and subjecting the containers to a heat treatment such that a reaction is caused to occur between the glass at least the surfaces of the containers and the tin compounds". The material used for treating the glass containers may be provided by reacting tin tetrachloride with organic substances containing carbonyl groups of moderate activity e.g. organic esters of ethyl, n-propyl, isopropyl, n-butyl and isobutyl alcohols with acetic, propionic and butyric acids. The resulting solution may be sprayed, in the presence of ambient atmosphere, on to the hot containers e.g. in the form of a fine mist after they leave the forming machine and before they enter the annealing lehr. GB patent specification 1 187 783 describes an analogous process to that described in 1 187 784 in which an organic compound of titanium is sprayed on to the hot glass containers in place of the organic compound of tin. The organic titanium compound may be produced, in an analogous manner to the organic compound of tin, by reacting titanium tetrachloride with an organic ester e.g. n-butyl acetate. Again, the resulting solution is sprayed onto the glass in the ambient atmosphere on the container production line.

It has also been proposed to use tin tetrachloride, applied either as a liquid spray or, more recently, in gaseous form, to apply a tin oxide coating to hot flat glass to form an electroconductive, infra-red reflecting coating on the hot glass surface; water is used to hydrolyse the tin tetrachloride and as a source of oxygen for formation of the tin oxide.

Processes involving use of the reactants in gaseous form (also called CVD or chemical vapour deposition processes) have certain advantages over spray processes for coating flat glass, especially when the reactants can be premixed before application to the glass. Unfortunately, tin tetrachloride reacts readily with water so that previous proposals to use tin tetrachloride and water vapour in gaseous form have usually involved supplying the gases separately to the glass surface and mixing them while in contact with the glass.

GB patent specification 2 044 137A relates to such a process in which discrete laminar streams of each reactant are formed and projected on to a hot glass substrate by bringing the streams together in reciprocal tangential contact over the glass. Titanium tetrachloride may be used as one of the gaseous reactants, in place of the tin tetrachloride, in order to form a titanium oxide coating. The patent also suggests supplying hydrogen to one of the gas streams to attenuate the violent reaction between the tin tetrachloride and the water vapour. This may be done either by direct addition of gaseous hydrogen, or by the addition of methanol, which is said to react in situ to produce the desired gaseous hydrogen.

GB patent specification 2 026 454B describes a process in which a coating chamber is positioned over a hot float glass ribbon as it advances from the float bath and successive gaseous streams of (1) preheated nitrogen carrier gas, (2) tin tetrachloride entrained in preheated nitrogen and (3) air, water vapour and hydrofluoric acid are introduced into the coating chamber so they flow along the glass substrate surface being coated as a substantially turbulence free layer. The patent specifies the concentration of water vapour and tin tetrachloride in the gaseous medium over the glass.

European patent specifications 0 365 239B1 and 0 376 240B1 describe a method and apparatus for depositing a tin oxide coating on a hot glass ribbon. A first gaseous stream of tin tetrachloride in preheated dry air is caused to flow along the surface of the hot ribbon of glass advancing beneath a coating chamber, a second turbulent stream of hydrofluoric acid and steam introduced into the coating chambers at right angles to the plane of the glass and direction of flow of the first gaseous stream, and the combined first and second gas streams drawn through the coating chamber over the glass under turbulent flow conditions. The method and apparatus may also be used to apply a coating of titanium oxide using titanium tetrachloride in place of the tin tetrachloride.

U.S. Pat. No. 4,590,096 describes a process in which a coating solution comprising a substantially solvent free mixture of an organotin chloride and a reactive organic fluorine compound soluble in or miscible with the organotin chloride is introduced to a preheated carrier gas stream which contains sufficient water vapour that the relative humidity of the gas stream at 18° C. is about 6% to about 100%. The resulting gas stream is passed over a hot glass surface to deposit a fluorine doped tin oxide coating on the hot glass. A wide range of organotin compounds may be used, and the possibility of using tin tetrachloride is mentioned. Similarly, a wide range of organic fluorine compounds, including oxygen containing compounds, for example trifluoroacetic acid and ethyltrifluoroacetate, may be used. Some of the fluorine-containing dopants have limited solubilities in the organotin compounds used, and an optional solubiliser may be used to increase the solubility of the fluorine dopant on the organotin compound; acetic anhydride, ethyl acetate, hexane, methyl isobutyl ketone and butyraldehyde are listed as non-limiting examples of the solubilisers that may be used. However, the U.S. patent, in common with the other patents utilising chemical vapour deposition methods to deposit a metal oxide from a gaseous metal tetrachloride, utilises water vapour as the source of oxygen.

U.S. Pat. No. 4,751,149 Vijaykumar et al is concerned with deposition of zinc oxide coatings by chemical vapour deposition at low temperature (600 to 350° C., preferably 100° to 200° C.) on heat sensitive photoconductor substrates, and proposes to deposit the zinc oxide coatings from an organozinc compound and an oxidant, which may be an oxygen containing organic compound e.g. an ester, and an inert carrier gas. Although the patent is not entirely clear, it apparently proposes to introduce separate streams of the organozinc compound and oxidant into the deposition chamber, and certainly there is no proposal to pre-mix these components together before delivery to the coating chamber.

It would be advantageous to provide a method for depositing tin or titanium oxide coatings by a CVD process applied to hot flat glass using a premixture of the corresponding metal tetrachloride as a low cost reactant and a source of oxygen without premature reaction between the metal tetrachloride and oxygen source (previously water) resulting in formation of metal oxide in the coating equipment with consequent problems and inefficiency. It would be particularly advantageous if the method allowed for deposition of the coating at high rates.

It is an object of the present invention to provide a method for obtaining tin and titanium oxide coatings on a substrate at high deposition rates. High deposition rates are important when coating substrates in a manufacturing process. This is particularly true for an on-line float glass process where the glass ribbon is traveling at a specific line speed and where the ribbon requires a specific coating thickness. The deposition rates obtained with the preferred embodiments of the present invention may be ten times higher than the deposition rates with other known methods for depositing titanium oxide coatings. Especially high deposition rates, particularly for titanium oxide, may be achieved with the present invention using a precursor mixture including an ester with a β hydrogen.

Another object of the present invention is to provide a method for obtaining a tin oxide or titanium oxide coating wherein the thickness of the coating can be varied based upon the particular organic compound utilized as a source of oxygen in the precursor mixture.

A further object is to obtain a titanium oxide coating at high deposition rates with a refractive index of at least 2.4.

A still further object is to produce tin and titanium oxide coatings at high deposition rates using low cost chlorinated precursors.

SUMMARY OF THE INVENTION

In accordance with the present invention, there is provided a chemical vapour deposition process for laying down a tin oxide or titanium oxide coating on a hot glass substrate using a precursor gas mixture containing the corresponding metal tetrachloride and an organic source of oxygen, without the requirement for inclusion of water vapour and the consequent risk of premature reaction.

The present invention provides a process for depositing a tin oxide or titanium oxide coating on hot flat glass comprising the steps of (a) preparing a precursor gas mixture containing the corresponding metal tetrachloride and an organic oxygen containing compound as a source of oxygen for formation of the metal oxide, (b) maintaining said precursor gas mixture at a temperature below the temperature at which the metal tetrachloride reacts to form the metal oxide while delivering the mixture to a coating chamber opening on to the hot glass, (c) introducing the precursor gas mixture into the coating chamber whereby the mixture is heated to cause deposition of the corresponding metal oxide incorporating oxygen from the organic compound on to the hot glass surface.

Surprisingly, a wide range of oxygen-containing organic compounds may be used as the source of oxygen, without requiring the presence of water vapour or gaseous oxygen, including compounds normally considered reducing agents rather than oxidising agents, for example, alcohols.

However, the preferred organic compounds are carbonyl compounds, especially esters; and particularly good results have been obtained using esters having an alkyl group with a β hydrogen. The alkyl group with a β hydrogen will normally contain two to ten carbon atoms.

It is preferred to use organic compounds, especially esters, containing from two to ten carbon atoms, since larger molecules tend to be less volatile and hence less convenient for use in the CVD process of the present invention.

Particularly preferred esters for use in the practice of the present invention include ethyl formate, ethyl acetate, ethyl propionate, isopropyl formate, isopropyl acetate, n-butyl acetate and t-butyl acetate.

The method of the present invention is generally practiced in connection with the formation of a continuous glass ribbon substrate, for example during a float glass production process. However, the method of the present invention may be employed in coating other flat glass substrates either on-line or off-line.

The present invention involves the preparation of a precursor gas mixture which includes tin or titanium tetrachloride and an organic oxygen containing compound; a carrier gas or diluent, for example, nitrogen, air or helium, will normally also be included in the gas mixture. Since thermal decomposition of the organic oxygen containing compound may initiate the metal oxide deposition reaction at a high rate, it is desirable that the precursor mixture be kept at a temperature below the thermal decomposition temperature of the organic oxygen compound to prevent prereaction of the gaseous mixture with formation of the metal oxide.

The gaseous mixture is maintained at a temperature below that at which it reacts to form the metal oxide, and delivered to a location near a flat glass substrate to be coated, the substrate being at a temperature above said reaction temperature (and above the decomposition temperature of the organic oxygen compound in the precursor gas mixture).

The precursor gas mixture is thereafter introduced into the vapor space directly over the substrate. The heat from the substrate raises the temperature of the precursor gas above the thermal decomposition temperature of the organic oxygen compound. The organic oxygen compound then decomposes with reaction with the metal tetrachloride producing a metal dioxide coating on the substrate.

The present invention permits the production of tin and titanium oxide coatings deposited on the hot glass at a high deposition rate e.g. over 130 Å/second and, in preferred embodiments, over 250 Å per second.

The deposition rate is dependent upon the particular organic oxygen containing compound used, and the concentrations of both the organic oxygen containing compound and the metal chloride, as well as the temperature of the glass. For any particular combination of compounds, the optimum concentrations (and in particular the optimum proportion of organic oxygen containing compound to metal tetrachloride) and flow rates for rapid coating deposition may be determined by simple trial. However, it will be appreciated that the use of higher concentrations of reactants and high gas flow rates is likely to result in a less efficient overall conversion of the reactants into coating, so that the optimum condition for commercial operation may differ from the conditions which provide the highest deposition rates.

The method of the invention permits the production, at high rates, of titanium oxide and tin oxide coatings on hot flat glass substrates on line during the glass production process. The titanium oxide coatings may be produced with a high refractive index (at least 2.4) permitting the achievement of desired optical effects, especially when used in combination with other coating layers. The tin oxide coatings may be doped, for example with fluorine, increasing their electrical conductivity and infra red reflectivity, and hence their utility as electrical conducting coatings and/or low emissivity coatings in architectural glazing and other applications.

BRIEF DESCRIPTION OF THE DRAWINGS

The above, as well as other advantages of the present invention, will become readily apparent to those skilled in the art from the following detailed description of preferred embodiments when considered in the light of the accompanying drawings in which:

FIG. 1 is a schematic view of a vertical section of an apparatus for practicing a float glass process which includes gas distributors suitably positioned to enable the practicing of the method of the present invention.

FIG. 2 is broken sectional view of an article coated according to this invention.

DESCRIPTION OF THE PREFERRED EMBODIMENT

Figure 3:
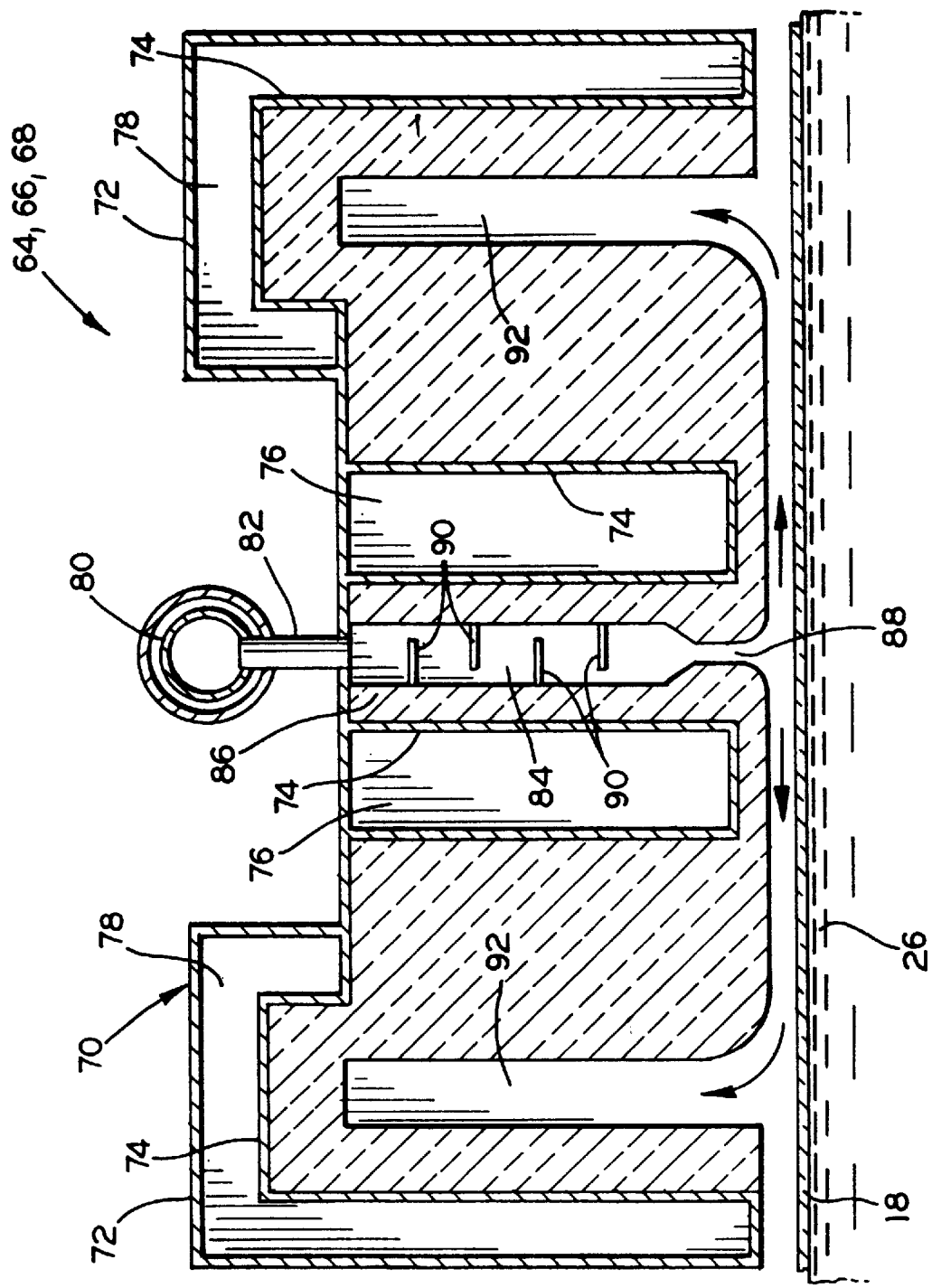
FIG. 3 is an enlarged schematic end view of a gas distributor beam suitable for use in practicing the present invention.

Referring now more particularly to the drawings, there is illustrated generally at 10 in FIG. 1 a float glass installation utilized as a means for practicing the method of the present invention. The float glass apparatus more particularly comprises a canal section 12 along which molten glass 14 is delivered from a melting furnace (not shown), to a float bath section 16 wherein a continuous glass ribbon 18 is formed in accordance with the well known float process. The glass ribbon 18 advances from the bath section 16 through an adjacent annealing lehr 20 and a cooling section 22. The continuous glass ribbon 18 serves as the substrate upon which the metal oxide coating is deposited in accordance with the present invention.

The float section 16 includes a bottom section 24 within which a bath of molten tin 26 is contained, a roof 28, opposite sidewalls 30, and end walls 32. The roof 28, side walls 30, and end walls 32 together define an enclosure 34 in which a non-oxidizing atmosphere is maintained to prevent oxidation of the molten tin.

Additionally, gas distributor beams 64, 66 and 68 are located in the bath section 16. The gas distributor beams 64 and 66 in the bath section may be employed to apply additional coatings onto the substrate prior to applying the tin or titanium oxide coating by the method of the present invention. The additional coatings may include silicon and silica.

In operation, the molten glass 14 flows along the canal 36 beneath a regulating tweel 38 and downwardly onto the surface of the tin bath 26 in controlled amounts. On the tin bath the molten glass spreads laterally under the influences of gravity and surface tension, as well as certain mechanical influences, and it is advanced across the bath to form the ribbon 18. The ribbon is removed over lift out rolls 40 and is thereafter conveyed through the annealing lehr 20 and the cooling section 22 on aligned rolls 42. The application of the coating of the present invention may take place in the float bath section 16, or further along the production line, for example in the gap between the float bath and the annealing lehr, or in the annealing lehr.

A suitable non-oxidizing atmosphere, generally nitrogen or a mixture of nitrogen and hydrogen in which nitrogen predominates, is maintained in the bath enclosure 34 to prevent oxidation of the tin bath. The atmosphere gas is admitted through conduits 44 operably coupled to a distribution manifold 46. The non-oxidizing gas is introduced at a rate sufficient to compensate for normal losses and maintain a slight positive pressure, on the order of about 0.001 to about 0.01 atmosphere above ambient atmospheric pressure, so as to prevent infiltration of outside atmosphere. Heat for maintaining the desired temperature regime in the tin bath 26 and the enclosure 34 is provided by radiant heaters 48 within the enclosure. The atmosphere within the lehr 20 is typically atmospheric air, while the cooling section 22 is not enclosed and the glass ribbon is open to the ambient atmosphere. Ambient air may be directed against the glass ribbon as by fans 50 in the cooling section. Heaters (not shown) may also be provided within the annealing lehr for causing the temperature of the glass ribbon to be gradually reduced in accordance with a predetermined regime as it is conveyed therethrough.

FIG. 1 illustrates the use of gas distributor beams 64, 66 and 68 positioned in the float bath 16 to deposit the various coatings on the glass ribbon substrate. The gas distributor beam is one form of reactor that can be employed in practicing the process of the present invention.

A conventional configuration for the distributor beams suitable for supplying the precursor materials in accordance with the invention is shown generally schematically at FIG. 3. An inverted generally channel-shaped framework 70 formed by spaced inner and outer walls 72 and 74 defines enclosed cavities 76 and 78. A suitable heat exchange medium is circulated through the enclosed cavities 76, 78 in order to maintain the distributor beams at a desired temperature.

The precursor gas mixture is supplied through a fluid cooled supply conduit 80. The supply conduit 80 extends along the distributor beam and admits the gas through drop lines 82 spaced along the supply conduit. The supply conduit 80 leads to a delivery chamber 84 within a header 86 carried by the framework. Precursor gases admitted through the drop lines 82 are discharged from the delivery chamber 84 through a passageway 88 toward a coating chamber defining a vapour space opening on to the glass where they flow along the surface of the glass 18 in the direction of the arrows in FIG. 3.

Baffle plates 90 may be provided within the delivery chamber 84 for equalizing the flow of precursor materials across the distributor beam to assure that the materials are discharged against the glass 18 in a smooth, laminar, uniform flow entirely across the distributor beam. Spent precursor materials are collected and removed through exhaust chambers 92 along the sides of the distributor beam.

Various forms of distributor beams used for chemical vapour deposition are suitable for the present method and are known in the prior art.

Figure 4:
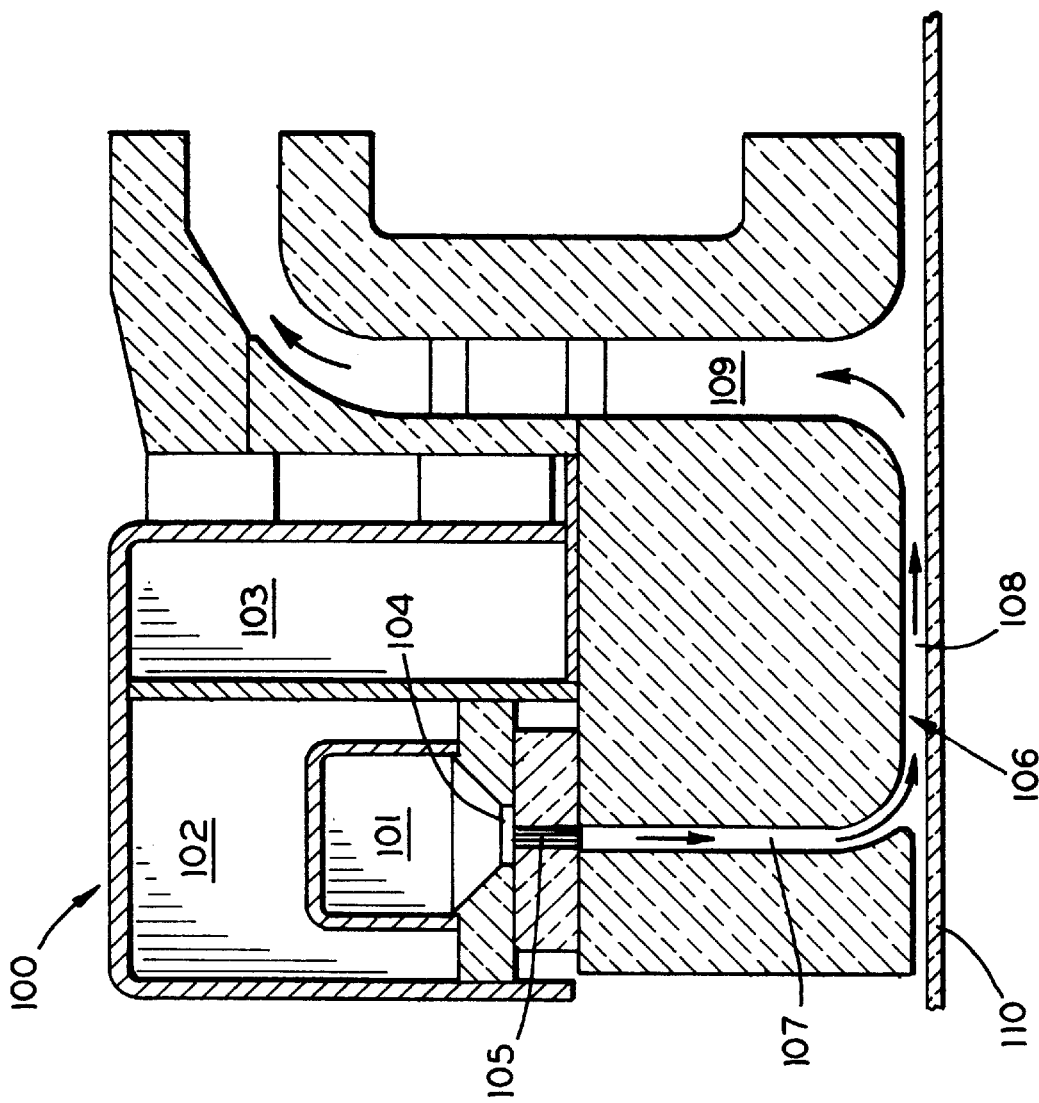
FIG. 4 is an enlarged schematic end view of an alternative gas distributor beam which may be used in practicing the present invention.

One such an alternative distributor beam configuration is illustrated schematically in FIG. 4 of the drawings. Using this distributor, which is generally designated 100 (and more fully described in European patent EP 0 305 102B), the precursor gas mixture is introduced through a gas supply duct 101 where it is cooled by cooling fluid circulated through ducts 102 and 103. Gas supply duct 101 opens through an elongated aperture 104 into a gas flow restrictor 105.

Gas flow restrictor 105 is of the kind more fully described in UK patent specifications GB 1 507 996, and comprises a plurality of metal strips longitudinally crimped in the form of a sine wave and vertically mounted in abutting relationship with one another extending along the length of the distributor. Adjacent crimped metal strips are arranged "out of phase" to define a plurality of vertical channels between them. These vertical channels are of small cross-sectional area relative to the cross-sectional area of gas supply duct 101, so that the gas is released from the gas flow restrictor 105 at substantially constant pressure along the length of the distributor.

The coating gas is released from the gas flow restrictor into the inlet side 107 of a substantially U-shaped guide channel generally designated 106 comprising inlet leg 107, coating chamber 108 which opens onto the hot glass substrate 110 to be coated, and exhaust leg 109, whereby used coating gas is withdrawn from the glass. The rounded corners of the blocks defining the coating channel promote a uniform laminar flow of coating parallel to the glass surface across the glass surface to be coated.

The following examples (in which gas volumes are expressed under standard conditions, i.e. one atmosphere pressure and ambient temperature, unless other stated) which constitute the best mode presently contemplated by the inventor for practicing the invention, are presented solely for the purpose of further illustrating and disclosing the present invention, and are not to be construed as a limitation on, the invention:

EXAMPLES 1 TO 5

In this series of Examples, a bi-directional coating reactor of the type shown in FIG. 3 was employed in the laboratory to deposit a titanium oxide coating.

In Examples 1, 2 and 3, the glass was heated on a conveyor furnace to simulate the coating reaction conditions of a float glass process in order to test the method of the present invention. The furnace utilized in-line rollers to convey a glass substrate through a heating zone prior to practicing the method of the present invention. In Example 1, the glass substrate was float glass which had been initially provided with a silica coating. The silica coating was deposited on the float glass through a known chemical vapour deposition process utilizing a precursor of monosilane in an oxygen enriched atmosphere. The silica deposition forms no part of the present invention.

In accordance with the present invention, a titanium oxide coating was deposited on the silica coated substrate. The substrate was at a temperature of a 1170° F./630° C. and the substrate line speed was at 300 inches/8 meters per minute.

To deposit the titanium oxide, a precursor gas mixture was developed comprising titanium tetrachloride, ethyl acetate, oxygen, and helium. Helium was included in the precursor mixture as a carrier for the reactants. The precursor mixture was prepared by simultaneously introducing all four gas streams through a manifold system. An in line static mixer was used to ensure a homogeneous precursor mixture. The volume percent composition of the precursor mixture was 0.7% titanium tetrachloride, 17.2% ethyl acetate, 7.2% oxygen, and 74.9% helium, with the flow rates for the components at the manifold being as shown in the accompanying Table 1.

The temperature of the precursor mixture was kept above 300° F./150° C. in order to prevent the adduct reaction of titanium tetrachloride and ethyl acetate. The precursor temperature was also kept below the 950° F.–1130° F. (510° C.–610° C.) thermal decomposition temperature range of ethyl acetate in order to prevent the mixture from prereacting.

The precursor mixture was introduced into the reactor just above the moving substrate. The temperature at the precursor tower was 250° F./120° C. The temperature at the reactor face was 350° F./175° C. The higher substrate temperature initiated the thermal decomposition of the ethyl acetate which then resulted in the deposition of the titanium oxide.

The resulting coated glass was allowed to cool in air and the coating analysed. It was found to be titanium oxide with a carbon content of 2.5–3.5 atomic percent. The thickness of the titanium oxide coating was measured 490 Å and the thickness and growth rate (150 Å per second) are shown in Table 1. The optical properties of the resulting product included an observed Illuminant C transmittance (10° observer) of 62.3% and an observed Illuminant C reflectivity of 35.6%. The extinction coefficient was 0.008 at 550 nm, and the refractive index of the titanium oxide coating was 2.44.

In Examples 2 and 3 the coating procedure set out in Example 1 was repeated, except that in Example 2 ethyl formate was used as the organic source of oxygen, and in Example 3 isopropanol was used as the organic source of oxygen and uncoated glass (in place of the silicon oxide coated glass of Examples 1 and 2) was used as the substrate. The gas flow rates used and, in the case of Example 2, the thickness and growth rate of the titanium oxide coating produced are shown in Table 1. In Example 3, the isopropanol burned in the reactor leaving only particulate titanium oxide on the glass, the corresponding deposition rate therefore being quoted as 0 Å/second.

The procedure for Examples 4 and 5 was as used in the previous Examples (the reactor temperature and the substrate being identical to Example 1), except that the substrate was static and not dynamic. The static sample was positioned under the reactor for 10 seconds. Under static conditions, the residence time of the substrate under the reactor is increased from the dynamic conditions by a factor of five.

In Example 4, methyl acetate was used as the organic source of oxygen, and in Example 5 t-butyl acetate was used; in each case a titanium oxide coating was produced. The gas flow rates, resulting titanium oxide coating thickness and coating growth rates are as shown in Table 1. The relatively slow growth rate achieved using methyl acetate is discussed hereinafter.

TABLE 1

| Example | Flow rates (liters/minute) | | | | Thickness Å | Growth rate Å/sec |
|---|---|---|---|---|---|---|
| | Titanium tetrachloride | Organic oxygen compound | Oxygen | Helium | | |
| 1 | 0.2 | 4.8 ethyl acetate | 2.0 | 20.9 | 490 | 150 |
| 2 | 0.5 | 1.6 ethyl formate | 6.0 | 17.4 | 800 | 250 |
| 3 | 0.45 | 1.5 isopropanol | 4.0 | 15.45 | 0 | 0 |
| 4 | 0.5 | 1.2 methyl formate | 6.0 | 17.4 | <100 | <10 |
| 5 | 0.5 | 0.5 t-butyl acetate | 6.0 | 16.5 | 1300 | 130 |

EXAMPLE 6

A float glass process was used in producing a continuous glass ribbon having a thickness of 0.125 inches/3 mm at a line speed of 434 inches/11 meters per minute. The glass temperature was at 1140° F./615° C. at the desired point of application in the float bath section of a titanium oxide coating using a coating reactor similar to that shown in FIG. 3. The temperature at the precursor tower was 400° F./205° C. and the temperature at the reactor face was 500° F./260° C. Prior to practicing the method of the present invention, a silica coating was deposited on the glass substrate in the float bath section at a thickness of about 339 Å. The same chemical vapor deposition process as described in Example 1 was used to deposit the silica coating The silica deposition forms no part of the present invention.

The precursor gas mixture was developed comprising titanium tetrachloride and ethyl acetate in a helium carrier gas. Oxygen was not used in the precursor as result of earlier Examples indicated that the coating reaction was not sensitive to the oxygen concentration. The precursor mixture was prepared by simultaneously introducing the three components through a manifold system. The volume percent composition of the precursor mixture was 0.6% titanium tetrachloride, 1.8% ethyl acetate, and 97.5% helium. The flow rates for the components were 480.0 l/m of helium, 3.0 l/m of titanium tetrachloride, 9.2 l/m of ethyl acetate The total flow rate for the precursor mixture was 492.2 l/m.

The resulting titanium oxide coating was 684 Å thick. The carbon content of the coating was less than 2 atomic percent. The growth rate of the coating was 309 Å per second.

EXAMPLE 7

The same procedure carried out Example 6 was utilized in this Example. The substrate comprised coatings of silicon and then silica over the glass substrate. The coatings were deposited by a known chemical vapor deposition process in the float bath section. The silicon coating was deposited by CVD from monosilane with a non-oxidizing carrier gas. The silica coating was then deposited onto the silicon coating through the use of the same procedure as described in Example 1.

The precursor for the titanium oxide coating included titanium tetrachloride and ethyl acetate in a helium carrier gas. The volume percent composition of the precursor was 0.5% titanium tetrachloride, 1.9% ethyl acetate, and 97.6% helium. The corresponding flow rates for the components were 480.0 l/m of helium, 2.4 l/m of titanium tetrachloride, 9.2 l/m of ethyl acetate. The total flow rate for the precursor mixture was 491.6 l/m.

The resulting coated article 52 is illustrated in FIG. 2. The glass substrate 54 is depicted with a stack of multiple coatings 56. The coatings comprise a layer of silicon 58, a layer of silica 60, then a titanium oxide coating 62 on top of the article. The titanium oxide coating on the resulting article had a thickness of 836 Å. The optical properties of the resulting coating stack included an observed Illuminant C transmittance of 13.1% and an observed Illuminant C reflectivity of 82.5%. The growth rate of the titanium oxide coating was 378 Å per second.

EXAMPLES 8–13

In this series of Examples, a static coater was used in the laboratory to apply a tin oxide coating on to a float glass substrate carrying a colour suppressing silicon oxide layer produced as described in European patent EP 0 275 662B.

The float glass to be coated was supported on a nickel block in a reactor vessel and the block heated from below by electric heating elements to provide a glass temperature of 1085° F./585° C. A flat graphite plate was mounted approximately 0.4 inches/10 mm above the glass and parallel thereto to provide a gas flow path 0.4 inches/10 mm deep between the glass surface bearing the silicon oxide layer and the plate.

A precursor gas mixture containing tin tetrachloride and an organic source of oxygen, in air and a small proportion of additional nitrogen as carrier gas, was delivered through a gas line maintained at a temperature of 435° F.±25° F./225° C.±15° C. and provided with a fish tail nozzle opening on to the gas flow path over the hot glass in a general direction parallel to the glass surface. The total carrier gas flow rate was 13 m³/hour. The flow rates of the tin tetrachloride, and the nature and flow rates of the organic compound used, were as shown in the accompanying Table 2. In Examples 9 and 11, small amounts of 40% hydrogen fluoride were incorporated in the precursor gas mixture to dope the resulting tin oxide coating with fluorine, as shown in the Table.

The gas flow containing the reactant gases was applied for approximately 8 seconds, and the coating apparatus and coated glass then allowed to cool under a flow of air at 345° F./225° C. On dismantling the coating apparatus, the delivery gas line, nozzle and plate defining the gas flow path over the glass found to be free, in each case, from deposit, indicating an absence of undesirable prereaction. In each case, the glass had a tin oxide coating applied over the silicon oxide, the thickness of the coating varying with distance from the fishtail nozzle. The maximum thickness and corresponding growth rate for each precursor gas mixture used is shown in Table 2. The emissivity, resistivity and haze of the samples producing using hydrogen fluoride to incorporate a fluorine dopant (Examples 9 and 11) were measured and the results reported in Table 2.

This series of Examples shows that an organic source of oxygen can be used as part of a premixed precursor gas mixture comprising tin tetrachloride to deposit a tin oxide coating without significant undesirable prereaction detrimentally affecting the coating process e.g. by deposition of tin oxide in the gas supply ducts. Moreover, if desired, a source of dopant, such as hydrogen fluoride, may be incorporated in the gaseous premixture to reduce the emissivity and resistivity of the coating while continuing to avoid significant detrimental prereaction.

In its essential details, the invention is a continuous chemical vapor deposition process for laying down tin oxide and titanium oxide coatings onto a glass substrate at high deposition rates through the use of the corresponding metal tetrachloride and an organic compound used as a source of oxygen in a preformed precursor gas mixture.

The metal tetrachlorides are preferred sources of the respective metals because of the availability and cost of the raw material.

It has been found, especially when depositing titanium oxide coatings from titanium tetrachloride, that, in order to form the metal oxide at the optimum deposition rates, it is desirable to use an organic oxygen containing compound which is an ester, particularly an ester in which the group derived from the alcohol is an alkyl group with a β hydrogen. Additionally, the decomposition temperature of the

TABLE 2

| Example | $SnCl_4$ Flow Rate (ml/min) | Precursor Gas Mixture Organic Oxygen Source Compound | Flow Rate (ml/min) | 40% HF Flow Rate (ml/min) | Max tin oxide thickness Å | Max growth rate Å/second | Emissivity | Resistivity ohm/cm | Haze |
|---|---|---|---|---|---|---|---|---|---|
| 8 | 12 | ethyl acetate | 10 | — | 2750 | 344 | — | — | — |
| 9 | 12 | ethyl acetate | 10 | 1 | 2680 | 335 | 0.25 | $5.3 \times 10^{-4}$ | 0.4% |
| 10 | 12 | butyl acetate | 13.4 | — | 3460 | 432 | — | — | — |
| 11 | 12 | butyl acetate | 13.4 | 1.3 | 2880 | 360 | 0.25 | $6.9 \times 10^{-4}$ | 0.6% |
| 12 | 6 | isopropyl alcohol | 120 | — | 2284 | 262 | — | — | — |
| 13 | 17 | trifluoracetic acid | 16.2 | — | 2840 | 335 | — | — | — |

EXAMPLE 14

In this Example, a coating distributor as illustrated schematically in FIG. 4 was used in a float bath to apply a coating of tin oxide by a method in accordance with the invention. The ribbon speed was approximately 233 inches per minute/350 minutes per hour and the glass thickness was 0.05 inches/1.2 mm. The glass temperature was approximately 1170° F./630° C. The temperature of the gas supply duct 101 which served as a primary gas mixing chamber was maintained at 300° F./150° C. and the 'static' waffle gas distributor 105 was approximately 645° F./340° C. The tin tetrachloride and butyl acetate vapors were delivered by bubbling nitrogen through the liquids maintained at 175° F./80° C. in bubblers and, hence, through separate heated conduits to gas supply duct 101. The vapors mixed at the primary chamber, passed through the waffle pack gas distributor, and then under laminar flow conditions through U-shaped guide channel 106 comprising coating chamber 108 opening on to the hot glass ribbon.

The flow rates used were sufficient to obtain tin tetrachloride:butyl acetate molar ratios of between 1:1 and 1:5. The trial was carried out for 5 hours. On dismantling the coater it was discovered that the cooled surfaces and the associated conduits were over 90% free of deposits, thus showing that tin tetrachloride and butyl acetate used for producing a tin dioxide coating on glass can be premixed with one another without substantial prereaction. A thin tin oxide coating was obtained on the glass ribbon.

It will be appreciated that various changes and modifications can be made from the specific details of the invention as incorporated in the foregoing Examples without departing from the spirit and scope thereof as defined in the appended claims.

ester should not be greater than the reaction temperature of the coating precursor gas mixture at the desired point of application. Esters utilized in the precursor gas mixture that have a β hydrogen and appropriate decomposition temperatures will deposit the coatings at high deposition rates. The preferred group of esters used in practicing the present invention includes the group consisting of ethyl formate, ethyl acetate, ethyl propionate, isopropyl formate, isopropyl acetate, n-butyl acetate, and t-butyl acetate.

In general an ester decomposes in a continuous fashion over a given temperature range. In the present invention, the thermal decomposition temperature of the ester is defined as the temperature at which the unimolecular decomposition rate constant of the ester is 0.01/sec. The unimolecular decomposition rate constants of common esters such as ethyl acetate and t-butyl acetate are well known and can be found in the chemical literature. For ethyl acetate and t-butyl acetate, the thermal decomposition temperatures using the above definition are 935 and 650° Fahrenheit (500° C. and 344° C.), respectively One skilled in the art will recognize that the choice of ester and specific deposition temperature employed will determine the optimum coating growth rate. Reaction temperatures below the defined thermal decomposition temperature, but within the decomposition range of the selected ester, will result in lower coating growth rates.

In accordance with the present invention, the alkyl group of an ester used in the coating precursor gas mixture may be a carbon compound having a range of 2–10 carbon atoms. The lower limit of the range is dictated by the β hydrogen requirement on the alkyl group. The upper limit is to avoid flammability and volatility issues that arise when the alkyl group contains more than ten carbon atoms.

In practicing the method of the present invention, a manifold may be used to connect and regulate the individual gas streams to formulate the coating precursor gas mixture. A common delivery line may be used to deliver the precursor gas mixture from the manifold to the gas beam distributor. An in line static mixer may be used in the delivery line to ensure a homogeneous gas mixture. Additionally, the baffles in the gas distributor beam, illustrated in FIG. 3, or a gas flow restrictor as described with reference to FIG. 4, may provide further mixing of the precursor gas at the reactor stage.

In many of the Examples, oxygen was included in the coating precursor gas mixture. However, the deposition rate of the metal oxide coating was not sensitive to the oxygen concentrations, and no oxygen gas was used in Examples 6 or 7 showing the inclusion of oxygen to be unnecessary The concentration of the reactive components of the coating precursor gas mixture may be selected to obtain the optimum coating growth rate. The concentration of metal tetrachloride is generally 0.1 to 5.0 percent by volume in the precursor gas mixture. The concentration of metal tetrachloride is based upon the amount of metal needed to provide the desired coating thickness in the available residence time. Thus the metal tetrachloride concentration is adjusted according to process variables, such as the line speed of the ribbon in a float glass process.

The concentration of the organic oxygen compound in the coating precursor gas mixture is generally one to five times the concentration of the metal tetrachloride, being selected within this range based upon the deposition temperature. When using an ester, lower deposition temperatures will result in slower ester decomposition rates and therefore, will require greater concentrations of the ester to react with the metal tetrachloride. In Examples 6 and 7, the optimum concentration of the ethyl acetate in the precursor gas mixture is 1 to 3 times the concentration of the titanium tetrachloride. Concentrations above or below the optimum range will produce metal oxide coatings at lower coating growth rates.

The temperature of the precursor gas mixture is critical for control of the reaction, in particular to avoid undesirable pre-reaction or adduct formation resulting in formation of an involatile product in the precursor lines. In one preferred embodiment, especially applicable when using an ester, the temperature is maintained above 300° F./150° C. in the precursor gas lines. The precursor gas mixture is also preferably kept below the thermal decomposition temperature of the organic oxygen compound to prevent prereaction of the mixture.

The present inventive process utilizes the heat from the substrate to initialize the coating reaction. In on-line situations, such as the float glass process, the substrate is formed at extremely high temperatures. Therefore, the method of the present invention may be applied at a point in the float glass process where the substrate temperature is lowered but is still above the temperature at which the coating is formed (and preferably after the glass ribbon has substantially finished stretching i.e. below 1380° F./750° C.). Off-line applications of the present invention will require heating the substrate to a temperature above the decomposition temperature of the ester.

In practicing the method of the present invention in the float glass process, the preferred point of application is in the float bath section. The temperature range at the point of application for the coating is usually about 1100°–1320° F./590°–715° C. The temperature is an important operating parameter because it influences the concentration of the organic compound utilized in the precursor gas mixture. The temperatures of the substrate in the float bath section are relatively stable and therefore exhibit little variation at the point of application. In examples 6 and 7 using ethyl acetate, the preferred substrate temperature range is 1100°–1250° F./590° C.–680° C.

The heat from the substrate raises the temperature of the precursor gas mixture above the temperature required for coating formation (and when an ester is used as the organic compound above thermal decomposition temperature of the ester). The metal deposition reaction may be initiated by the decomposition of the organic oxygen compound. When titanium tetrachloride is used in combination with an ester having an alkyl group with a β hydrogen, the titanium oxide coating then forms on the substrate at decomposition rates that are ten times higher than known coating methods. In the on-line application with a float glass ribbon process, the ribbon passes under the gas distributor beam at a relatively fast rate. The metal oxide coating is deposited onto the float glass ribbon as the ribbon passes under the coater.

The inventors propose the following theory regarding the chemical reaction that may take place when using an ester having an alkyl group with a β hydrogen. However, the inventors do not wish to limit the invention to just this possible explanation, and therefore offer it merely as an aid to understanding the results of the present inventive process.

The inventors propose that as the ester decomposes, the carbon-hydrogen bond on one of the β hydrogens breaks and the hydrogen transfers to the carbonyl group eliminating an alkene and forming a caboxylic acid. The hydrolysis reaction simultaneously takes place between the carboxylic acid and the metal tetrachloride leading to the formation of the metal oxide coating on the substrate.

In general, the resulting article produced in accordance with the present invention comprises a substrate having a titanium oxide or tin oxide coating. The coating may be applied directly to the substrate or as a layer in a plurality of coatings on a substrate. The rate of deposition of the metal oxide coating is effected by the decomposition rate of the organic oxygen compound. At constant reaction temperatures different organic oxygen compounds will provide different coating growth rates because of the difference in the decomposition temperatures. Therefore, the desired metal oxide coating growth rate for a given system is selected by matching a specific organic oxygen compound to the precursor gas mixture temperature and the substrate temperature at the point of application.

The deposition rate of the titanium oxide coating in the present invention may be ten times greater than rates in known deposition methods. The present inventive process permits deposition rates over 130 Å per second with some deposition rates measured well over 300 Å per second. The higher deposition rates for titanium oxide yield a coating with a refractive index greater than 2.4.

In the present invention, the resulting oxide coating contains little residual carbon from the decomposition of the organic oxygen compound, especially when an ester is used. Carbon is an undesirable byproduct of the coating reaction because high levels of carbon in deposition coatings create absorption problems with the coating. The concern in using an organic oxygen compound in the coating precursor gas mixture is that decomposition will result in levels of carbon that adversely affect the absorption properties of the finished glass. The carbon content in the coatings produced from the method of the present invention showed less than four atomic percent of carbon where measured. This low level of carbon will not significantly affect absorption properties of the coating.

It is to be understood that the forms of the invention herewith shown and described are to be taken as illustrative embodiments only of the same, and that various changes in the shape, size and arrangement of parts, as well as various procedural changes, may be resorted to without departing from the spirit of the invention.

What is claimed is:

1. A chemical vapor deposition process for depositing a titanium oxide coating on a glass substrate at deposition rates of at least 130 Å/sec, comprising:
   (a) pre-mixing a uniform, precursor gas mixture containing titanium tetrachloride and an ester, said ester having an alkyl group with a β hydrogen;
   (b) delivering said precursor gas mixture at a temperature below the thermal decomposition temperature of said ester to a location near a glass substrate to be coated, said substrate being at a temperature above the thermal decomposition temperature of said ester; and
   c) introducing said precursor gas mixture into a vapor space above said glass substrate wherein said ester thermally decomposes and thereby initiates a reaction with said titanium tetrachloride to produce a titanium oxide coating on said glass substrate.

2. A process for depositing a titanium oxide coating on a glass substrate as recited in claim 1, wherein said ester is selected from the group consisting of ethyl formate, ethyl acetate, ethyl propionate, isopropyl formate, isopropyl acetate, n-butyl acetate, and t-butyl acetate.

3. A process for depositing titanium oxide coating on a glass substrate as recited in claim 1, wherein the glass substrate is a float glass ribbon having a temperature in the range of about 1100°–1320° F./590° C.–715° C.

4. A process for depositing a titanium oxide coating on a glass substrate as recited in claim 1, wherein the titanium tetrachloride in the precursor gas mixture is at a concentration of about 0.1–5.0% by volume.

5. A process for depositing a titanium oxide coating on a glass substrate as recited in claim 1, wherein the organic oxygen containing compound in the precursor gas mixture is at a concentration of about 1 to 5 times the concentration of the titanium tetrachloride.

6. A process for depositing a titanium oxide coating on a glass substrate as recited in claim 1, wherein said ester is ethyl acetate and said glass substrate is a float glass ribbon.

7. A process for depositing a titanium oxide coating on a glass substrate as recited in claim 1, wherein the glass substrate has a silica coating thereon, and said titanium oxide coating is deposited over the silica coating.

8. A process for depositing a titanium oxide coating on a glass substrate as recited in claim 1, wherein a silicon coating is first deposited on said glass substrate, a silica coating is deposited on said silicon coating, and said titanium oxide coating is deposited over the silica coating.

9. A process for depositing a titanium oxide coating on a glass substrate as recited in claim 1, wherein said titanium oxide coating has a refractive index greater than 2.4.

10. A process for depositing a titanium oxide coating on a glass substrate as recited in claim 1, wherein the titanium oxide coating has a residual carbon content less than 4 atomic percent.

11. A process for depositing a titanium oxide coating on a glass substrate as recited in claim 1, wherein said precursor gas mixture includes helium as a carrier gas.

12. A process for depositing a titanium oxide coating a glass substrate as recited in claim 1, wherein the ester has an alkyl group having 2–10 carbon atoms.

13. A process for depositing a titanium oxide coating on hot flat glass as recited in claim 1, wherein the precursor gas mixture flows over the glass surface to be coated under laminar flow conditions.

14. A chemical vapor deposition process for depositing a titanium oxide coating on a float glass ribbon at deposition rates of at least 130 Å/sec comprising:
   (a) pre-mixing a uniform, precursor gas mixture containing titanium tetrachloride and an ester, said ester having an alkyl group with a β hydrogen;
   (b) delivering said precursor gas mixture at a temperature below the thermal decomposition temperature of said ester to a location near a float glass ribbon to be coated, said float glass ribbon being at a temperature range above the thermal decomposition temperature of said ester; and
   (c) introducing said precursor gas mixture into a vapor space above said float glass ribbon wherein said ester thermally decomposes and thereby initiates a reaction with said titanium tetrachloride to produce a titanium oxide coating on said float glass ribbon.

15. A chemical vapor deposition process for depositing a titanium oxide coating on a substrate at a conversion efficiency such that, depending on the desired coating thickness, deposition rates of at least 130 Å/sec can be attained, comprising:
   (a) pre-mixing a uniform, precursor gas mixture containing titanium tetrachloride and an ester, said ester having an alkyl group with a β hydrogen;
   (b) delivering said precursor gas mixture at a temperature below the thermal decomposition temperature of said ester to a location near a substrate to be coated, said substrate being at a temperature above the thermal decomposition temperature of said ester; and
   (c) introducing said precursor gas mixture into a vapor space above said substrate wherein said ester thermally decomposes and thereby initiates a reaction with said titanium tetrachloride to produce a titanium oxide coating on said substrate.

16. A process for depositing a titanium oxide coating on a substrate as recited in claim 15, wherein said ester is selected from the group consisting of ethyl formate, ethyl acetate, ethyl propionate, isopropyl formate, isopropyl acetate, n-butyl acetate, and t-butyl acetate.

17. A process for depositing titanium oxide coating on a substrate as recited in claim 15, wherein the substrate is a float glass ribbon.

18. A process for depositing a titanium oxide coating on hot flat glass as recited in claim 17, wherein the precursor gas mixture flows over the float glass ribbon to be coated under laminar flow conditions.

19. A process for depositing titanium oxide coating on a substrate as recited in claim 15, wherein said substrate is a float glass ribbon at a temperature in the range of about 1100°–1320° F./590° C.–715° C.

20. A process for depositing a titanium oxide coating on a glass substrate as recited in claim 15, wherein said ester is ethyl acetate and said substrate is a float glass ribbon.

21. A process for depositing a titanium oxide coating on a substrate as recited in claim 15, wherein the substrate has a silica coating thereon, and said titanium oxide coating is deposited over the silica coating.

22. A process for depositing a titanium oxide coating on a glass substrate as recited in claim 15, wherein a silicon coating is first deposited on said substrate, a silica coating is deposited on said silicon coating, and said titanium oxide coating is deposited over the silica coating.

23. A process for depositing a titanium oxide coating a glass substrate as recited in claim 15, wherein the ester has an alkyl group having 2–10 carbon atoms.

* * * * *